United States Patent [19]

Jacob

[11] 4,161,659
[45] Jul. 17, 1979

[54] SOLID STATE PROXIMITY SWITCH

[75] Inventor: Keith Jacob, Ann Arbor, Mich.

[73] Assignee: Scovill Manufacturing Company, Waterbury, Conn.

[21] Appl. No.: 914,133

[22] Filed: Jun. 9, 1978

Related U.S. Application Data

[63] Continuation-in-part of Ser. No. 857,584, Dec. 5, 1977.

[51] Int. Cl.² .................. H01H 35/38; G05D 7/06
[52] U.S. Cl. .................. 307/39; 200/81.9 M; 323/19; 323/24; 323/39; 335/205; 335/207; 361/180
[58] Field of Search .......... 200/81.9 M, 82 E; 307/39, 116; 323/19, 22 SC, 24, 39; 324/28 RS; 328/5; 335/151, 153, 154, 205, 207, 234, 281; 340/547, 551, 609, 611; 361/178–180

[56] References Cited

U.S. PATENT DOCUMENTS

| | | | |
|---|---|---|---|
| 3,305,805 | 2/1967 | Tann | 335/153 |
| 3,363,073 | 1/1968 | Bouguet | 200/81.9 M |
| 3,417,255 | 12/1968 | Kuecken | 307/39 |
| 3,496,380 | 2/1970 | Jones | 361/178 X |
| 3,504,235 | 3/1970 | Lee | 323/39 UX |
| 3,560,846 | 2/1971 | Bessko | 335/153 |
| 3,568,037 | 3/1971 | Williams et al. | 323/22 SC |
| 3,629,678 | 12/1971 | Tyler | 361/179 X |
| 3,967,224 | 6/1976 | Seeley | 335/151 |
| 4,038,926 | 8/1977 | Holberry | 335/207 X |
| 4,071,725 | 1/1978 | Smith et al. | 335/205 X |

OTHER PUBLICATIONS

GE SCR Manual, 3rd edition, 1964, pp. 106, 107.
Conley et al., "Magnetic Object Sensor", IBMTDB, vol. 5, No. 8, Jan. 1963, pp. 44, 45.
Burdick et al., "Reed Switch Contact Block", IBMTDB, vol. 9, No. 5, Oct. 1966, p. 512.

*Primary Examiner*—A. D. Pellinen
*Attorney, Agent, or Firm*—Price, Heneveld, Huizenga & Cooper

[57] ABSTRACT

A magnetic proximity sensing apparatus for sensing ferro-magnetic objects is especially well adapted for use with fluid cylinders having pistons formed from magnetically attracted material. The apparatus includes a magnetic actuator responsive to the proximity of the fluid cylinder piston or other ferro-magnetic object which closes a switch and enables electrical circuitry for controlling fluid valves or other apparatus. A reed switch mounted within a hollow, cylindrical, permanent magnet has a separate pole piece secured at one end of the reed switch. The proximity of a ferro-magnetic object changes the flux within the magnet, closing the reed switch. The circuitry is solid state and includes a silicon controlled rectifier acting as a gated switch for completing the circuit.

9 Claims, 5 Drawing Figures

SOLID STATE PROXIMITY SWITCH

CROSS REFERENCE TO RELATED APPLICATION

This application is a continuation-in-part of my previously filed application Ser. No. 857,584, entitled SOLID STATE PROXIMITY SWITCH, filed Dec. 5, 1977.

BACKGROUND OF THE INVENTION

1. Field of the Invention

This invention relates to proximity sensing apparatus; and, more particularly, to a magnetic proximity sensing device especially adapted for sensing ferrous metal such as the location of a ferrous piston in a fluid motive power cylinder, counting ferrous metal parts, or the proximity of some other ferrous metal member.

2. Prior Art

It is well known to control various apparatus by sensing the operation of fluid motive power cylinders of either the pneumatic or hydraulic type. By sensing the presence or position of the movable piston within the cylinder, one can control the operation of other apparatus in response to movement of that piston or, alternatively, control the length of the stroke of the fluid cylinder piston itself.

Although many types of proximity sensors have been previously devised, many require the presence of magnetic bodies within the part whose movement or proximity is being sensed in order to properly operate the proximity sensor. This is a particular problem with fluid motive power cylinders, a great many of which are manufactured without magnets in their piston bodies. Another problem often encountered is providing a sensor which can be relatively easily manufactured at a relatively low cost, yet continue to provide reliable indication of proximity under extended usage. In particular, sensors with mechanically linked parts tend to be susceptible to wear during extended use and to malfunction due to rough handling.

Known proximity sensors include applying the oscillations of an inductance and capacitance bridge network to a switching network. That is, the introduction of a ferrous material in proximity to a coil, providing the inductance, changes the oscillations in the inductance and capacitance bridge. The switching network includes a silicon controlled rectifier in combination with a diode bridge network. Such a proximity sensor is relatively complex and requires a relatively sensitive balancing of the inductance and capacitance bridge. Further, the switching network has two stages so that the signal from the inductance capacitance bridge is sufficiently amplified to cause switching between a power source and a load. Such a requirement of two stages also adds undesirable complexing and cost to a sensor.

Still another problem typically encountered in the use of proximity sensors with fluid cylinders is the attachment of the sensor to the body of the cylinder. For proper operation it is necessary that the sensing apparatus be secured as closely as possible to the cylinder itself. Prior known structures have included complicated, rigid structures fitting around the body of the cylinder which hold the sensor tightly against the cylinder body. Relatively rigid structures have also been used to attach the sensing apparatus to cylinder tie rods. However, since adjustment of the position of the sensors is often necessary when the piston stroke must be adjusted, such prior structures have often been difficult to move or adjust. Other structures have fixedly mounted the sensing apparatus at the ends of the cylinder eliminating flexibility necessary for complete utilization of the sensing apparatus.

In addition, it is desirable from a manufacturing standpoint to have a proximity sensing apparatus which is adaptable to many uses such as for counting metal parts, sensing the location of moving metal parts on rams or presses, or the like.

The present invention overcomes the above problems by providing a sensing apparatus which substantially eliminates the use of moving mechanical parts and is easily and securely attached to the existing structure of fluid cylinders and other apparatus without the necessity of providing additional complicated, rigid structure and without the necessity of disassembling any portion of the fluid cylinder. The present invention is self contained and does not require the addition or inclusion of magnets on any part of the body being sensed. Thus, the invention is especially useful with pre-existing fluid cylinders which do not include magnets in their piston bodies. Also, the invention can be effectively used in many applications such as sensing metal parts to count or locate the same, during inspection, serving as a limit switch or trigger for another event on various machinery, or providing a sensor in a visible or audible signaling system.

SUMMARY OF THE INVENTION

Systems embodying the present invention include a proximity detector and control circuit with a normally closed terminal, a normally open terminal and a common terminal adapted to be coupled between an AC source and a pair of alternately actuated loads. The proximity detector provides first and second signals representative of the absence or presence, respectively, of an object to be detected. The circuit includes a first solid state switching circuit coupled between the normally closed and the common terminals and having a control terminal coupled to the proximity detector and responsive to the first signal therefrom to provide a conduction path between the normally closed terminal and the common terminal, and a second solid state switching circuit coupled between the normally open and the common terminals and having a control terminal coupled to the proximity detector and responsive to the second signal therefrom to provide a conduction path between the normally open terminal and the common terminal.

DESCRIPTION OF THE PREFERRED EMBODIMENT

Figure 1:
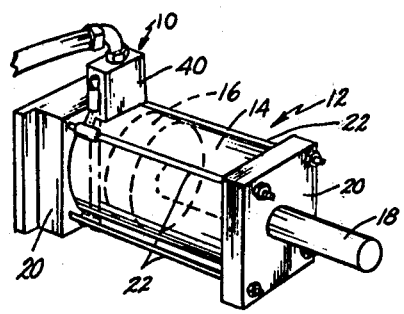
FIG. 1 is a perspective view of a typical fluid cylinder demonstrating the magnetic proximity sensing apparatus of the present invention secured to a tie rod of the cylinder.
Figure 3:
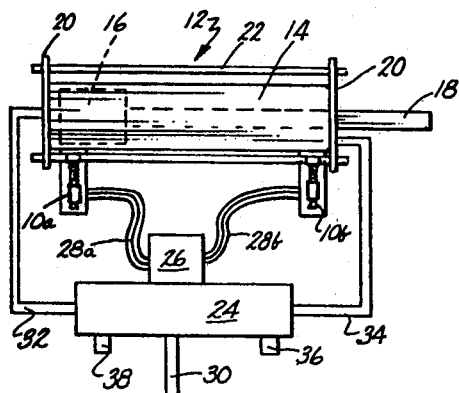
FIG. 3 is a schematic illustration of a pair of the magnetic proximity sensing devices of the present invention secured to a typical fluid motive power cylinder and connected to control the operation of the cylinder via a solenoid operated fluid valve.

Referring now to the drawings in greater detail, FIGS. 1 and 3 illustrate the magnetic proximity sensing apparatus 10 of the present invention secured to a fluid motive power cylinder 12 of the pneumatic type. Fluid cylinder 12 includes a right circular cylinder housing 14 preferably formed from a nonmagnetic material such as aluminum or brass including a piston 16 mounted for reciprocal movement therein. Piston 16 is secured to the end of push or connecting rod 18 which extends outwardly of at least one end of the cylinder for movement of an apparatus to be powered by the cylinder. The ends of housings 14 are closed by closure plates 20 which seal the ends of the cylinder to form a fluid tight housing. Closures 20 are securely held in place by a plurality of tie rods 22, in this case four, which are spaced equally about the circumference of the cylinder and hold the end closures securely against the ends of housing 14. Typically, piston 16 is formed from a ferro-magnetic material such as hardened steel or the like such that it will be magnetically attractable and attract magnets toward it.

As best seen in FIG. 3, operation of the pneumatic fluid cylinder 12 is typically controlled by means of a spool valve 24 or the like. Spool valve 24 in turn is typically operated by an electric solenoid operated pilot valve 26 cooperatingly associated with the spool valve 24. A pair of the magnetic sensing apparatus 10a and 10b are secured at spaced locations between two of the tie rods 22 supporting the cylinder 12 such that they lie generally tangentially along the side or sides of cylinder housing 14 against or in close proximity thereto. Sensors 10a and 10b are connected by electrical wires 28a and 28b to the pilot valve 26 to control insertion and exhaustion of fluid, in this case compressed air, on opposite sides of piston 16 for movement thereof.

For example, compressed air inserted through a supply line 30 to spool valve 24 is directed by appropriate conventional valving within the spool valve to fluid conduit 32. Conduit 32 inserts the fluid at the left end of the cylinder against piston 16 (FIG. 3). Simultaneously, fluid conduit 34 on the opposite side of piston 16 is opened via the valving in spool valve 24 to exhaust outlet 36. Pressure against the left end of piston 16 moves the piston to the right in FIG. 1 until it comes within the influence of the magnetic field of the magnet within sensor 10b at the right end of the cylinder. Sensor 10b senses the position of the piston head, closes an electric switch, signals pilot valve 26 by an electrical wiring 28b which closes fluid conduit 34 to halt the rightward movement of the piston head. In a similar manner, when piston 16 is moved to the left by compressed air inserted thereagainst through fluid conduit 34, sensor 10a will sense the presence of piston head 16, signal the valving, stopping the exhaust of air from the opposite side of the piston through exhaust outlet 38, and halt the leftward movement of the piston. Thus, location of sensors 10a and 10b controls the length of stroke of piston 16 within cylinder housing 14.

Figure 2:
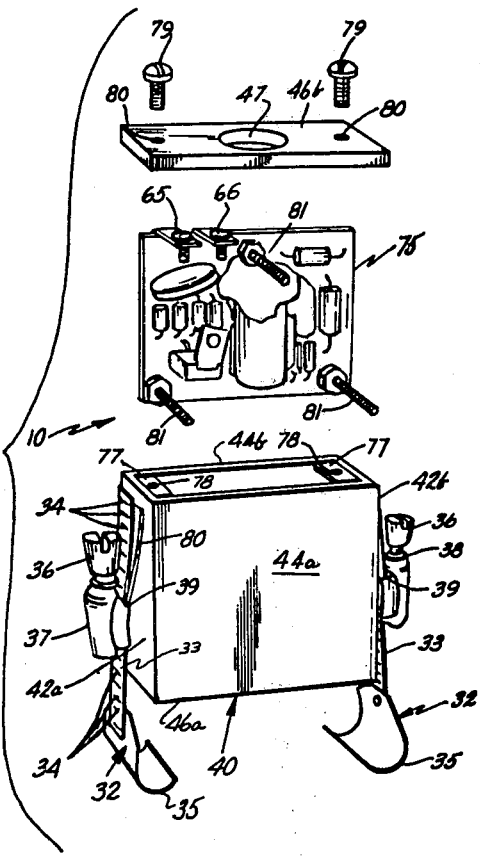
FIG. 2 is an exploded perspective view of a magnetic proximity sensing device in accordance with an embodiment of this invention.

As shown in FIGS. 1 and 2, magnetic proximity sensing apparatus 10 includes a generally rectangular housing 40 including generally planar sidewalls 42a, 42b, generally planar front and back walls 44a, 44b, a closed bottom end wall 46a, and a top end wall 46b having an opening 47 therethrough for insertion of electrical wiring. One or more of the sides, top, bottom, or end panels is removably secured by appropriate screws or the like to the other panels for access to the internal mechanism of the sensor. The housing 40 provides a cover to protect the internal mechanism from dust, dirt, and undesired tampering with the mechanism.

FIG. 2 is an exploded view which shows a printed circuit board 75 upon which are mounted the electrical components of sensing apparatus 10. Output terminals 65 and 66 extend from one side of circuit board 75 and electrically connect sensing apparatus 10 to electrical wires which would extend through opening 47. A pair of flanges 77 extend inwardly from the top portions of sidewalls 42a and 42b and each have an opening 78 for receiving a screw 79 extending through an opening 80 in end wall 46b. Printed circuit board 75 is positioned within housing 40 and aligned by three spacing posts 81 which extend generally perpendicularly outward from a major surface of circuit board 75 and are secured thereto. After printed circuit board 75 is within housing 40, an epoxy material can be used to encase printed circuit board 75 and fill housing 40 leaving terminals 65 and 66 exposed. The epoxy protects and seals the printed circuit board 75 against the environment and absorbs shocks.

In order to properly secure proximity sensing apparatus 10 generally tangentially against the side of cylinder housing 14 (FIGS. 1 and 3), a clamping arm 32 extends from each of two opposing sides of housing 40. Clamping arm 32 includes an elongated strap 33 having a plurality of transverse openings or slots 34 spaced longitudinally along the length of strap 33. A mount 37 supports a screw 36 and receives strap 33 so that the threads of screw 36 engage the openings or slots 34 of strap 33 thereby longitudinally moving strap 33 when screw 36 is turned. Mount 37 is coupled to the side of housing 40 and contains a threaded receiving opening 38 for receiving screw 36 and an elongated opening 39 for receiving strap 33 (FIG. 2). Coupled to the bottom extremity of strap 33, away from housing 40, is a hook or clamp member 35 curved to receive and retain a tie rod 22. The coupling between clamp 35 and strap 33 can be by means such as a rivet. Strap 33 can be sufficiently long so that it can couple to the tie rods 22 on the same side of cylinder 12 as housing 40 (shown in solid lines in FIG. 1) or on the other side of cylinder 12 from housing 40 (shown in phantom in FIG. 1). Clamping arm 32 allows sensing apparatus 10 to be secured as described without disassembly by simply loosening screws 36, positioning clamps 35 around tie rods 22 and thereafter tightening screws 36. The position of the sensing apparatus 10 may be adjusted along the length of the cylinder 12 merely by loosening screws 36, sliding the apparatus to the desired positioning, and retightening screws 36. Although two clamping arms, one on either side of housing 40, are preferred, sensor 10 can be clamped to the fluid cylinder or another device by only one clamping arm if strap 33 or 34 is sufficiently rigid. Clamping arm 32 forms no part of this invention and is more specifically described and claimed in a copending application Ser. No. 857,790, filed Dec. 5, 1977, by Charles W. Ward, entitled CLAMPING APPARATUS and assigned to the present assignee.

Figure 4:
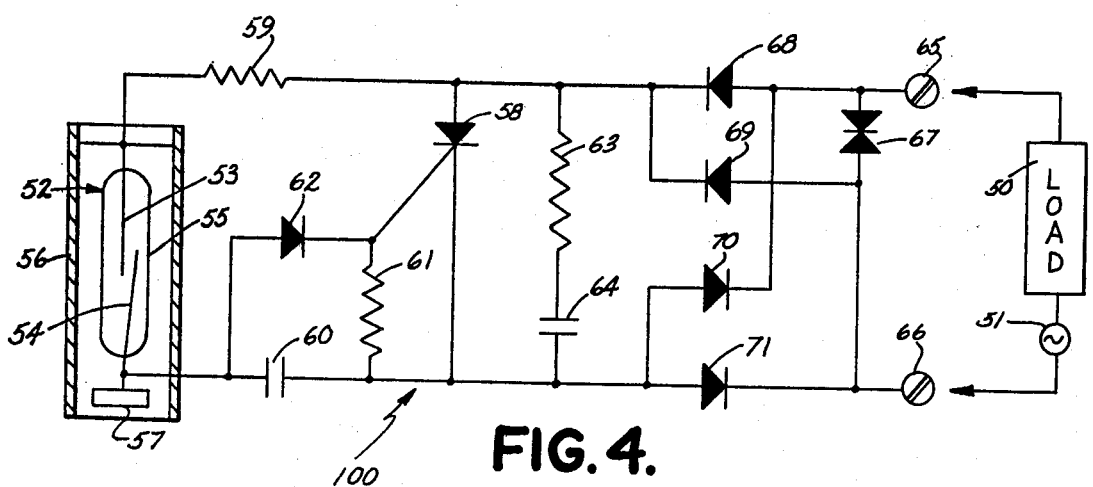
FIG. 4 is a schematic representation and diagram of the circuit of a magnetic proximity sensing device in accordance with an embodiment of this invention.

Referring to FIG. 4, there is shown the circuitry which completes an electric circuit 100 between a load 50 and an AC source 51. Completing a conduction path through circuit 100 is initiated by a reed switch 52 which includes internal contacts 53 and 54 within a glass envelope 55. A cylindrical magnet 56 has a longitudinal central opening for receiving glass envelope 55. A pole piece 57 is positioned adjacent one end of the opening within magnet 56 to concentrate the lines of flux of magnet 56 when a ferrous piston head comes into proximity of reed switch 52. A silicon controlled rectifier 58 acts as a switch responsive to reed switch 52 and has an input coupled through a resistor 59 to contact 53 and an output coupled to contact 54 through capacitor 60. The gate terminal of silicon controlled rectifier 58 is coupled to the output terminal of silicon controlled rectifier 58 by a resistor 61. Resistor 61 acts to provide a voltage between the gate and output terminals of rectifier 58 thereby providing a biasing voltage to switch rectifier 58 between a conducting and a nonconducting condition. The gate terminal of silicon controlled rectifier 58 is coupled to contact 54 through a filter diode 62.

The series combination of a resistor 63 and a capacitor 64 is coupled between the input and the output terminals of silicon controlled rectifier 58 to reduce the switching sensitivity of rectifier 58 to transient signals. Resistor 63 and capacitor 64 limit the rate of rise of voltage across silicon controlled rectifier 58 so that rectifier 58 is not falsely triggered. That is, an intermittent or transient closing of contacts 53 and 54 has a delayed and reduced effect because of resistor 63 and capacitor 64. Circuit 100 has output terminals 65 and 66 to which are coupled the series combination of load 50 and source 51. Across terminals 65 and 66 is coupled a metal oxide varistor 67 to protect against AC source transients and designed to conduct at a predetermined voltage. For example, varistor 67 can conduct at about 184 volts peak. Varistor 67 is desirable since silicon controlled rectifier 58 is susceptible to damage when exposed to unusually high peak voltages.

A bridge rectifier including diodes 68, 69, 70 and 71 is connected in a series closed loop with four nodes so that silicon controlled rectifier 58 is across two opposing nodes and load 50 is coupled across the remaining two opposing nodes. More specifically, diode 68 is coupled between output terminal 65 and the input of silicon controlled rectifier 58. Diode 69 is coupled between output terminal 66 and the input of silicon controlled rectifier 58. Diode 70 is coupled between the output of node of silicon controlled rectifier 58 and output terminal 65. Diode 71 is coupled between the output node of silicon controlled rectifier 58 and output terminal 66. The bridge rectifier in combination with silicon controlled rectifier 58 acts as an AC switch rather than a switch for current flowing in just one direction. That is, regardless of the cycle of AC source 51, the bridge rectifier supplies current to silicon controlled rectifier 58 and rectifier 58 will conduct whenever an appropriate signal is present at the gate terminal of rectifier 58.

Diodes 62 and capacitor 60 together form a contact bounce filter for reed switch 52 to eliminate transients due to electrical discontinuities between contact 53 and 54 caused by the bouncing of one contact against the other. That is, as current starts to flow through reed switch 52, capacitor 60 begins to charge and current flows through resistor 61 to develop a biasing voltage. If a temporary opening of contacts 53 and 54 takes place, capacitor 60 tends to discharge through resistor 61 thereby continuing to maintain a biasing voltage keeping rectifier 58 conductive. Of course, if contacts 53 and 54 remain open a longer time, indicating that the cylinder piston is no longer adjacent reed switch 52, capacitor 60 discharges, the biasing voltage across resistor 61 is reduced, and silicon controlled rectifier becomes nonconductive.

Resistor 59 limits the amount of current flowing through reed switch 52 by adjusting the resistance of two parallel paths, one including reed switch 52 and the other including rectifier 58. Nevertheless, resistor 59 is of such a value that sufficient current flows through reed switch 52 to provide a voltage biasing signal across resistor 61 to make conductive rectifier 58.

In operation, proximity of piston 16 to reed switch 52 causes an increase in magnetic flux in the air gap within permanent magnet 56. That is, there is increased magnetic flux through contacts 53 and 54 which are made of a material capable of being magnetized so that contacts 53 and 54 attract each other and close. Electrical connection between contacts 53 and 54 completes the circuit between the output junction of diodes 68 and 69 and the input junction of diodes 70 and 71. Current flows through resistor 59, reed switch 52, diode 62 and resistor 61. The voltage developed across resistor 61 is sufficient to turn on rectifier 58. When rectifier 58 turns on, a relatively low resistance path is completed coupling load 50 and a source 51. The time constant of the path including resistor 63 and capacitor 64, parallel to rectifier 58, is sufficiently short that it presents essentially an open circuit during each cycle of the alternating current of source 61.

Figure 5:
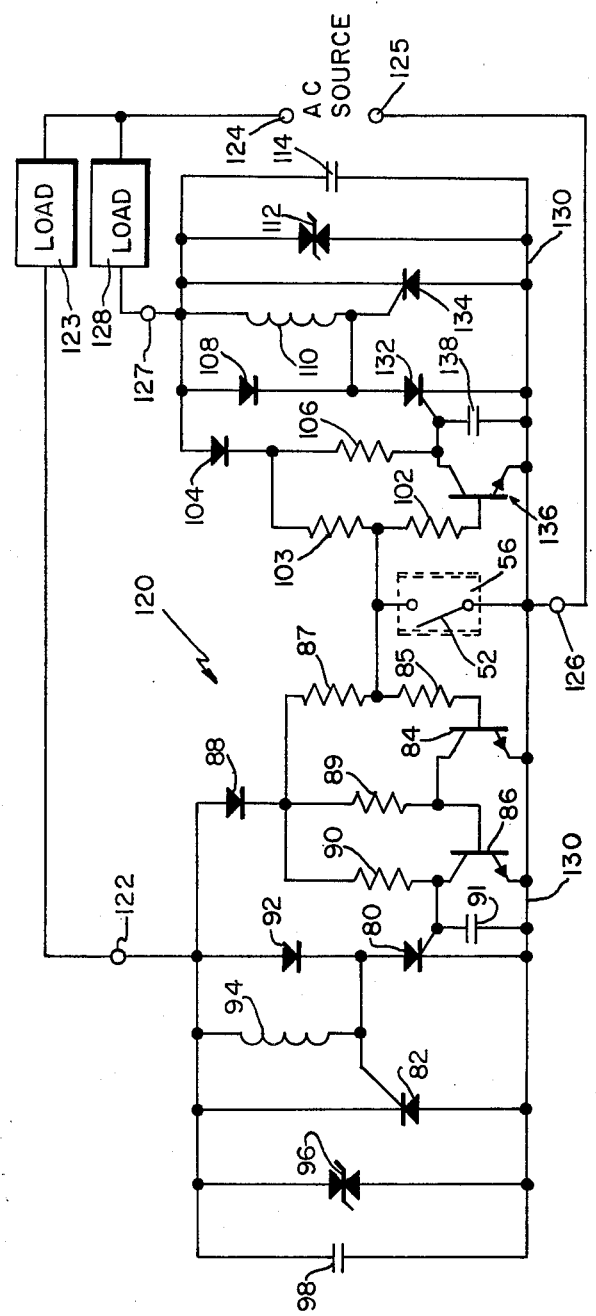
FIG. 5 is an electrical circuit diagram in schematic form of an alternative embodiment of the invention.

Referring now to FIG. 5, there is shown an alternative embodiment of the present invention by which a control circuit 120 provides a three terminal control with a normally closed terminal 122 providing current to a load 123 through alternating current source coupled to input terminals 124 and 125 through a common terminal 126 when the magnetic actuator switch 52 is open and provides a current path through a second load 128 through normally open terminal 127 when switch 52 is in a closed position. Thus, circuit 120 forms in conjunction with normally closed terminal 122, normally open terminal 127, and common terminal 126 a three terminal control device for alternately actuating loads 123 and 128 upon actuation of switch 52. In this embodiment, switch 52 is of identical construction to the magnetic actuator reed switch 52 shown in FIG. 4 and includes a cylindrical magnet 56 surrounding switch 52 as well as a field concentrating pole piece (not shown). Circuit 120 is mounted on a circuit board and within a housing such as shown in FIG. 2 for attachment to a cylinder in the same manner as shown in FIG. 1. It is to be understood, however, that the circuit 120 shown in FIG. 5 has many other applications in addition to that illustrated in FIG. 1.

The current flow path between the normally closed terminal 122 and common terminal 126 is through SCRs 80 and 82 which are triggered into conduction as described below by a pair of transistors 84 and 86 when switch 52 is in the open position. Similarly, a current path between normally open terminals 127 and common terminal 126 is provided by SCRs 132 and 134 which are triggered into conduction by transistor 136 when switch 52 is in a closed position.

Transistor 84 is an NPN transistor having an emitter terminal coupled to a common bus line 130, a base terminal coupled to switch 52 through a 22 K resistor 85 and to the terminal 122 through a 100 K resistor 87 and a diode 88. The collector terminal of transistor 84 is coupled to the base terminal of transistor 86 and to the cathode of diode 88 by means of a 100 K resistor 89. The emitter terminal of NPN transistor 86 is also coupled to bus 130 while its collector terminal is coupled to the gate terminal of SCR 80 and to the cathode of diode 88 by means of a 22 K resistor 90. A capacitor 91 is coupled between the gate of SCR 80 and bus 130. The anode of SCR 80 is coupled to terminal 122 by means of a diode 92. Coupled in parallel with diode 92 is a 1Hy inductor 94. SCR 82 has its anode coupled to bus 130 and its cathode coupled to terminal 122. The gate of SCR 82 is coupled to the junction of inductor 94 and the anode of SCR 80. A varistor 96 is coupled between terminals 122 and 126 as is a parallely coupled capacitor 98.

On the normally open contact side of circuit 120, NPN transistor 136 has its emitter terminal coupled to bus 130 and a base terminal coupled to switch 52 through a 22 K resistor 102. This junction is also coupled to the normally open terminal 127 through a 100 K resistor 103 and diode 104. The collector terminal of transistor 136 is coupled to the cathode of diode 104 by means of a 22 K resistor 106. The collector terminal is also coupled to the gate terminal of SCR 132 having a capacitor 138 coupled between its gate terminal and bus 130. The anode of SCR 132 is coupled to normally open terminal 127 by means of diode 108. In parallel with diode 108 is a 1Hy inductor 110. The anode of SCR 132 is also coupled to the gate terminal of SCR 134 having its anode coupled to bus 130. The cathode of SCR 134 is coupled to normally open terminal 127. Between terminals 127 and bus 130 is coupled a varistor 112 and capacitor 114.

The operation of circuit 120 to provide a conduction path between terminals 122 and 126 with switch 52 open and a conduction path between terminals 127 and 126 when switch 52 is closed is now presented. With switch 52 in the open position (i.e., no object in proximity with the switch) transistor 84 is rendered conductive by the positive bias voltage during the positive half cycle (terminal 124 positive) of the supply voltage from the AC source through diode 88 and resistors 87 and 85 applying drive current to the base of this transistor. With transistor 84 conductive, its collector pulls down the base of transistor 86 rendering transistor 86 nonconductive. This, in turn, permits capacitor 91 to charge through diode 88 and resistor 90, still during the positive half cycle of AC supply voltage, triggering SCR 80 into conduction. The anode to cathode current path for SCR 80 includes diode 92 and inductor 94 and completes the conduction path between terminals 122 and 126 through load 123. As the AC supply swings to zero and reverses, SCR 80 normally would be turned off but with the relatively large inductor 94 in series with the current path, it continues to supply current to SCR 80 as well as provide drive current to the gate of SCR 82. SCR 82 is therefore triggered on as SCR 80 turns off as the voltage of the AC source reverses (i.e., terminal 125 becomes positive with respect to terminal 124). Thus, SCR 82 is slaved to SCR 80 and the two operating together provide a continuous current path between normally closed terminal 122 and common terminal 126 coupling the AC source to load 123 when switch 52 is in an open position. Varistor 96 provides over voltage protection for these SCRs as does parallel capacitor 98. Capacitor 91 protects against false triggering of SCR 80 by transient voltages.

On the normally open side of circuit 120, with switch 52 in the open position, transistor 136 is rendered conductive thereby effectively grounding the gate of SCR 132 which remains nonconductive. When, however, an object is in the proximity of switch 52 and the switch closes, the base of transistor 136 is at the same voltage level as its emitter and is nonconductive. During the positive half cycle of the AC supply (terminal 124 positive) a current path through diode 104 and resistor 106 charges capacitor 138 to trigger SCR 132 into conduction. With switch 52 closed, transistor 84 is also turned off in turn turning on transistor 86 preventing triggering of SCR 80.

The anode to cathode current path for SCR 132 includes diode 108 and inductor 110 and as the AC source voltage reverses, as with SCR 80 and 82, the continuing current through inductor 110 maintains SCR 132 conductive until such time as the gate voltage of SCR 134 exceeds the threshold voltage and SCR 134 conducts as terminal 125 of the source becomes positive with respect to terminal 124. Thus, SCR 134 is slaved to SCR 132 and the two SCRs provide a continuous current path between the normally open terminal 127 and common terminal 126 to couple load 128 to the AC source when switch 52 is closed. Varistor 112 and parallel capacitor 114 provide overvoltage protection for the SCRs. Capacitor 138 protects against false triggering of SCR 132 by transient voltages.

Thus, with the parameter values selected for the circuit 120, including the 100 kohm resistors 87 and 103, the reed switch 52 draws very little current and therefore has an extended life in controlling the solid state switches. By incorporating the unique back to back SCR configuration with an inductor acting as a current source to slave the second SCR of each pair of SCRs to the first, a smooth switching transition between the SCRs is provided to provide a continuous current path through the respective loads as the AC power source reverses its polarity. In the preferred embodiment, the SCRs were commercially available units model No. MCR 106 while the transistors were also commercially available as model No. MPS 5172.

While two forms of the invention have been shown and described, other forms will be apparent to those skilled in the art. Therefore, it will be understood that the embodiments shown in the drawings and described above are merely for illustrative purposes and are not intended to limit the scope of the invention which is defined by the claims which follow.

The embodiments of the invention in which an exclusive property or privilege is claimed are defined as follows:

1. A proximity detector and control comprising:
a normally closed terminal, a normally open terminal and a common terminal adapted to be coupled between an AC source and a pair of alternately actuated loads;
a proximity detector providing first and second signals representative of the absence or presence, respectively, of an object to be detected;
a first solid state switching circuit coupled between said normally closed and said common terminals and having a control terminal coupled to said proximity detector and responsive to said first signal therefrom to provide a conduction path between said normally closed terminal and said common terminal; and
a second solid state switching circuit coupled between said normally open and said common terminals and having a control terminal coupled to said proximity detector and responsive to said second signal therefrom to provide a conduction path between said normally open terminal and said common terminal, wherein said first and second solid state switching circuits each includes a pair of controlled unidirectional conductive devices coupled to conduct current between said normally closed and normally open terminals and said common terminal in opposite directions.

2. The system as defined in claim 1 wherein each pair of controlled unidirectional conductive devices includes a first SCR having an inductor coupled in its anode to cathode current path and a second SCR having a gate terminal coupled to said inductor for triggering said second SCR on as said first SCR turns off.

3. The system as defined in claim 2 wherein said first solid state switching circuit further includes a two state transistor switch having first and second transistors with a base terminal of said first transistor coupled to said proximity detector and to a power source to be rendered conductive only in response to first signals from said proximity detector, said second transistor coupled to said first transistor and controlled thereby to be in an opposite state of conduction as said first transistor, said second transistor having a collector terminal coupled to a gate terminal of said first SCR and to a power source such that said first SCR is triggered into conduction only when said second transistor is turned off.

4. A proximity detector and control comprising:
a normally closed terminal, a normally open terminal and a common terminal adapted to be coupled between an AC source and a pair of alternately actuated loads;
a proximity detector providing first and second signals representative of the absence or presence, respectively, of an object to be detected;
a first solid state switching circuit coupled between said normally closed and said common terminals and having a control terminal coupled to said proximity detector and responsive to said first signal therefrom to provide a conduction path between said normally closed terminal and said common terminal;
a second solid state switching circuit coupled between said normally open and said common terminals and having a control terminal coupled to said proximity detector and responsive to said second signal therefrom to provide a conduction path between said normally open terminal and said common terminal, wherein said first and second solid state switching circuits each includes a pair of SCRs coupled to conduct current between said normally closed and normally open terminals and said common terminal in opposite directions and wherein each pair of SCRs includes a first SCR having an inductor coupled in its anode to cathode current path and a second SCR having a gate terminal coupled to said inductor for triggering said second SCR on as said first SCR turns off;
said first solid state switching circuit further includes a two stage transistor switch having first and second transistors with a base terminal of said first transistor coupled to said proximity detector and to a power source to be rendered conductive only in response to first signals from said proximity detector, said second transistor coupled to said first transistor and controlled thereby to be in an opposite state of conduction as said first transistor, said second transistor having a collector terminal coupled to a gate terminal of said first SCR and to a power source such that said first SCR is triggered into conduction only when said second transistor is turned off; and
said second solid state switching circuit includes a transistor having a base terminal coupled to said proximity detector and to said power source to be rendered conductive only in response to first signals from said proximity detector and having a collector terminal coupled to a power source and to a gate terminal of said first SCR of said second solid state switching circuit to trigger said first SCR only in response to second signals from said proximity detector which turn said transistor off.

5. The system as defined in claim 4 wherein said proximity detector comprises a reed switch, a cylindrical magnet surrounding said reed switch and a pole piece positioned near one end of said cylindrical magnet for actuating said reed switch when a ferro-magnetic body is in the proximity of said pole piece.

6. A proximity detector and control comprising:
a magnetic actuator means for selectively conditioning an electric circuit between a conductive and nonconductive condition, said magnetic actuator means including a reed switch positioned within a cylindrical permanent magnet and including a pole piece of a ferrous material positioned adjacent to and spaced from an end of said cylinder to concentrate the lines of magnetic flux acting on said reed switch whereby increasing the proximity of a ferro-magnetic object to said reed switch actuates said reed switch;
a normally closed terminal, a normally open terminal and a common terminal adapted to be coupled between an AC source and a pair of alternately actuated loads;
a first solid state switching circuit coupled between said normally closed and said common terminals and having a control terminal coupled to said reed switch and responsive to a first actuation state thereof to provide a conduction path between said normally closed terminal and said common terminal; and
a second solid state switching circuit coupled between said normally open and said common terminals and having a control terminal coupled to said reed switch and responsive to a second actuation state thereof to provide a conduction path between said normally open terminal and said common terminal wherein said first and second solid state switching circuits each includes a pair of SCRs coupled to conduct current between said normally closed and normally open terminals and said common terminal in opposite directions.

7. The system as defined in claim 6 wherein each pair of SCRs includes a first SCR having an inductor coupled in its anode to cathode current path and a second SCR having a gate terminal coupled to said inductor for triggering said second SCR on as said first SCR turns off.

8. The system as defined in claim 7 wherein said first solid state switching circuit further includes a two stage transistor switch having first and second transistor with a base terminal of said first transistor coupled to said reed switch and to a power source to be rendered conductive only when said reed switch is open, said second transistor coupled to said first transistor and controlled thereby to be in an opposite state of conduction as said first transistor, said second transistor having a collector terminal coupled to a gate terminal of said first SCR and to a power source such that said first SCR is triggered into conduction only when said second transistor is turned off.

9. A proximity detector and control comprising:

a magnetic actuator means for selectively conditioning an electric circuit between a conductive and nonconductive condition, said magnetic actuator means including a reed switch positioned within a cylindrical permanent magnet and including a pole piece of a ferrous material positioned adjacent to and spaced from an end of said cylinder to concentrate the lines of magnetic flux acting on said reed switch whereby increasing the proximity of a ferrmagnetic object to said reed switch actuates said reed switch;

a normally closed terminal, a normally open terminal and a common terminal adapted to be coupled between an AC source and a pair of alternately actuated loads;

a first solid state switching circuit coupled between said normally closed and said common terminals and having a control terminal coupled to said reed switch and responsive to a first actuation state thereof to provide a conduction path between said normally closed terminal and said common terminal;

a second solid state switching circuit coupled between said normally open and said common terminals and having a control terminal coupled to said reed switch and responsive to a second actuation state thereof to provide a conduction path between said normally open terminal and said common terminal, wherein said first and second solid state switching circuits each includes a pair of SCRs coupled to conduct current between said normally closed and normally open terminals and said common terminal in opposite directions and wherein each pair of SCRs includes a first SCR having an inductor coupled in its anode to cathode current path and a second SCR having a gate terminal coupled to said inductor for triggering said second SCR on as said first SCR turns off;

said first solid state switching circuit further includes a two stage transistor switch having first and second transistors with a base terminal of said first transistor coupled to said reed switch and to a power source to be rendered conductive only when said reed switch is open, said second transistor coupled to said first transistor and controlled thereby to be in an opposite state of conduction as said first transistor, said second transistor having a collector terminal coupled to a gate terminal of said first SCR and to a power source such that said first SCR is triggered into conduction only when said second transistor is turned off; and said second solid state switching circuit includes a transistor having a base terminal coupled to said reed switch and to said power source to be rendered conductive only when said reed switch is open and having a collector terminal coupled to a power source and to a gate terminal of said first SCR of said second solid state switching circuit to trigger said first SCR only when said reed switch is closed and said transistor is turned off.

* * * * *